(12) United States Patent
Song

(10) Patent No.: US 11,988,718 B2
(45) Date of Patent: May 21, 2024

(54) BATTERY DIAGNOSING APPARATUS AND METHOD

(71) Applicant: LG ENERGY SOLUTION, LTD., Seoul (KR)

(72) Inventor: Yee-Gahng Song, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 0 days.

(21) Appl. No.: 17/716,461

(22) Filed: Apr. 8, 2022

(65) Prior Publication Data

US 2022/0413057 A1  Dec. 29, 2022

(30) Foreign Application Priority Data

Feb. 9, 2021  (KR) .......................... 10-2021-0018522

(51) Int. Cl.
*G01R 31/3842* (2019.01)

(52) U.S. Cl.
CPC ................................ *G01R 31/3842* (2019.01)

(58) Field of Classification Search
CPC .................................................. G01R 31/3842
See application file for complete search history.

(56) References Cited

U.S. PATENT DOCUMENTS

| | | | | |
|---|---|---|---|---|
| 2014/0125345 A1* | 5/2014 | Sejima | ............... | G01R 31/3648 324/426 |
| 2015/0028878 A1* | 1/2015 | Tsujimoto | ............. | H01M 10/44 324/426 |
| 2015/0369874 A1* | 12/2015 | Park | ........................ | B60L 58/12 702/63 |
| 2016/0209473 A1 | 7/2016 | You et al. | | |
| 2021/0325469 A1* | 10/2021 | Torai | .................. | G01R 31/3842 |

FOREIGN PATENT DOCUMENTS

| | | | | |
|---|---|---|---|---|
| CN | 111611774 | A | | 9/2020 |
| CN | 111624494 | A * | 9/2020 | ........... G01R 31/367 |
| JP | 5445958 | B2 | | 3/2014 |
| JP | 6155830 | B2 | | 7/2017 |
| KR | 10-2016-0000317 | A | | 1/2016 |
| KR | 10-2016-0090140 | A | | 7/2016 |
| KR | 10-2078765 | B1 | | 2/2020 |
| KR | 10-2020-0098875 | A | | 8/2020 |
| KR | 10-2156858 | B1 | | 9/2020 |

* cited by examiner

*Primary Examiner* — Manish S Shah
*Assistant Examiner* — Sharad Timilsina
(74) *Attorney, Agent, or Firm* — Birch, Stewart, Kolasch & Birch, LLP

(57) ABSTRACT

A battery diagnosing apparatus includes: a characteristic value extracting unit for extracting a plurality of characteristic values for each of a plurality of batteries; a dimension reducing unit for reducing a dimension of a characteristic value profile representing a distribution of the plurality of batteries using a predetermined algorithm based on the plurality of characteristic values extracted by the characteristic value extracting unit; and a state diagnosing unit for detecting an outlier in the characteristic value profile whose dimension is reduced by the dimension reducing unit, and diagnosing a state of each of the plurality of batteries based on the detected outlier.

11 Claims, 4 Drawing Sheets

BATTERY DIAGNOSING APPARATUS AND METHOD

TECHNICAL FIELD

The present disclosure relates to a battery diagnosing apparatus and method, and more particularly, to a battery diagnosing apparatus and method capable of diagnosing a state of a battery.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Conventionally, in order to diagnose the state of the battery, the state of the battery is diagnosed by using a critical deviation from a data group of a single characteristic. However, the battery has a plurality of characteristic components, and the cause of degradation is compounded by various components. Therefore, it is necessary to develop a technology for diagnosing the state of the battery by comprehensively considering multi-dimensional information about the battery, rather than diagnosing the state of the battery by a single characteristic as in the prior art.

DISCLOSURE

Technical Problem

The present disclosure is designed to solve the problems of the related art, and therefore the present disclosure is directed to providing a battery diagnosing apparatus and method capable of diagnosing a state of a battery based on a plurality of battery characteristics having orthogonality.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery diagnosing apparatus according to one aspect of the present disclosure may comprise a battery management system (BMS) including: a characteristic value extracting unit configured to extract a plurality of characteristic values for each of a plurality of batteries; a dimension reducing unit configured to reduce a dimension of a characteristic value profile representing a distribution of the plurality of batteries using a predetermined algorithm based on the plurality of characteristic values extracted by the characteristic value extracting unit; and a state diagnosing unit configured to detect an outlier in the characteristic value profile whose dimension is reduced by the dimension reducing unit, and diagnose a state of each of the plurality of batteries based on the detected outlier.

The state diagnosing unit may be configured to set a criterion value in the characteristic value profile whose dimension is reduced, calculate a weight and a Euclidean distance for each of the plurality of batteries based on the set criterion value, and detect the outlier based on the weight and the Euclidean distance.

The state diagnosing unit may be configured to calculate the weight for the plurality of batteries based on compactness of the plurality of batteries with respect to the set criterion value.

The state diagnosing unit may be configured to calculate an outlier index by multiplying the Euclidean distance and the weight corresponding to each of the plurality of batteries, and detect the outlier based on the calculated outlier index and a preset threshold value.

The state diagnosing unit may be configured to detect a battery among the plurality of batteries of which the calculated outlier index is equal to or greater than the threshold value as the outlier.

The state diagnosing unit may be configured to classify the plurality of batteries into at least one group in the characteristic value profile, and detect the outlier for each group.

The characteristic value extracting unit may be configured to extract the plurality of characteristic values having orthogonality with each other for each of the plurality of batteries.

The dimension reducing unit may be configured to set perplexity, which is one of parameters of the predetermined algorithm, to be less than the number of the plurality of batteries.

The state diagnosing unit may be configured to normalize the characteristic value profile whose dimension is reduced, and detect the outlier from the normalized characteristic value profile.

A battery pack according to another aspect of the present disclosure may comprise the battery diagnosing apparatus according to one aspect of the present disclosure.

An energy storage system according to still another aspect of the present disclosure may comprise the battery diagnosing apparatus according to one aspect of the present disclosure.

A battery diagnosing method according to still another aspect of the present disclosure may comprise: a characteristic value extracting step of extracting, via a battery management system (BMS), a plurality of characteristic values for each of a plurality of batteries; a dimension reducing step of reducing, via the BMS, a dimension of a characteristic value profile representing a distribution of the plurality of batteries using a predetermined algorithm based on the plurality of characteristic values extracted in the characteristic value extracting step; an outlier detecting step of detecting, via the BMS, an outlier in the characteristic value profile whose dimension is reduced in the dimension reducing step; and a state diagnosing step of diagnosing, via the BMS, a state of each of the plurality of batteries based on the outlier detected in the outlier detecting step.

Advantageous Effects

According to one aspect of the present disclosure, the state of a plurality of batteries may not be diagnosed based on a single characteristic value, but the state of the plurality of batteries may be diagnosed according to a plurality of characteristic values. Accordingly, the state of the plurality of batteries may be diagnosed more accurately.

In addition, since the state of a plurality of batteries is diagnosed based on the characteristic value profile whose dimension is reduced, the state may be diagnosed quickly, and system resources required for the state diagnosis may be saved.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
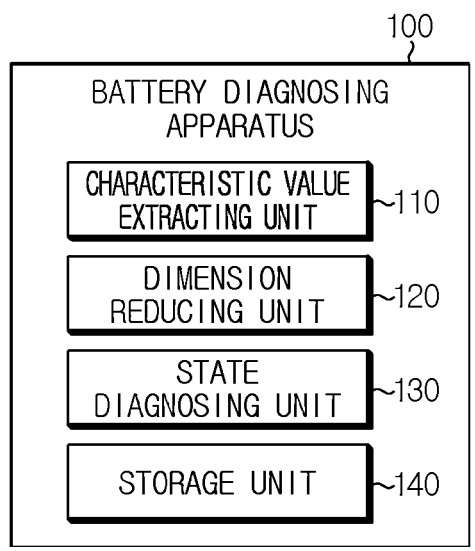
FIG. 1 is a diagram schematically showing a battery diagnosing apparatus according to an embodiment of the present disclosure.

FIG. 1 is a diagram schematically showing a battery diagnosing apparatus 100 according to an embodiment of the present disclosure.

Referring to FIG. 1, the battery diagnosing apparatus 100 according to an embodiment of the present disclosure may include a characteristic value extracting unit 110, a dimension reducing unit 120, and a state diagnosing unit 130.

The characteristic value extracting unit 110 may be configured to extract a plurality of characteristic values for each of a plurality of batteries.

Here, the battery means a physically separable one independent cell having a negative electrode terminal and a positive electrode terminal. For example, a lithium-ion battery or a lithium polymer battery may be regarded as a battery.

Preferably, the characteristic value extracting unit 110 may be configured to extract the plurality of characteristic values having orthogonality with each other for each of the plurality of batteries.

Here, orthogonality may mean an independent characteristic without correlation between characteristic values.

For example, characteristic values having orthogonality with each other may include voltage, current, temperature, internal resistance, voltage change rate, and temperature change rate.

In addition, the characteristic values having orthogonality with each other may include characteristic values of the same type extracted at a predetermined time interval. Here, the same type of characteristic values extracted at a predetermined time interval may include the same type of characteristic values extracted at every predetermined cycle period. For example, the same type of characteristic values may include the same type of characteristic values extracted at a start time point of every predetermined cycle period, the same type of characteristic values extracted at a highest output time point of every predetermined cycle period, and the like.

In the above, although a limited embodiment has been described, it is noted that the characteristic value extracting unit 110 may extract characteristic values without limitation as long as the characteristic values have orthogonality with each other, among several characteristic values that can be extracted from batteries.

The dimension reducing unit 120 may be configured to reduce a dimension of the characteristic value profile representing the distribution of the plurality of batteries using a predetermined algorithm based on the plurality of characteristic values extracted by the characteristic value extracting unit 110.

Specifically, the characteristic value profile may be a profile representing a distribution of a plurality of batteries for a plurality of characteristic values.

For example, it is assumed that the characteristic value items extracted by the characteristic value extracting unit 110 are x, y and z. The characteristic value profile may be expressed as a 3-dimensional profile in the form of (x, y, z), and each point in the characteristic value profile may represent a corresponding battery. For example, when an N number of batteries are provided in total, an N number of points may be included in the characteristic value profile.

In addition, the dimension reducing unit 120 may reduce the dimension of the characteristic value profile using a predetermined dimension reducing algorithm.

For example, the dimension reducing algorithm may be applied without limitation as long as it is an algorithm capable of reducing the dimension of a multi-dimension profile of 2 or more dimensions. Preferably, t-SNE (t-Stochastic Neighbor Embedding) may be applied as the dimension reducing algorithm.

Figure 2:
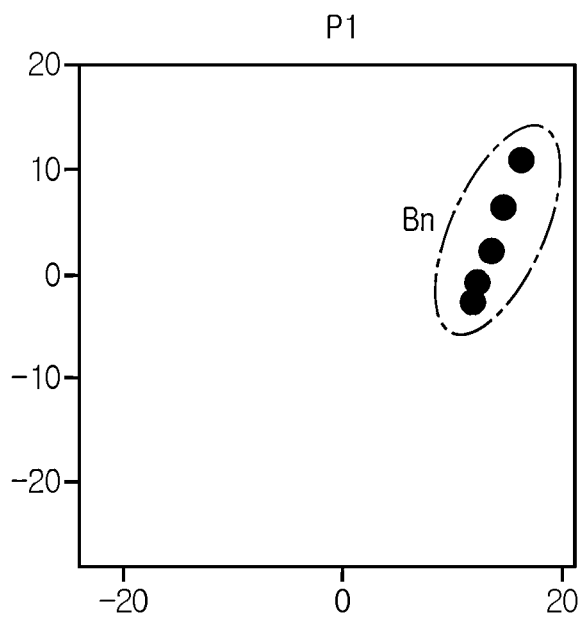
FIG. 2 is a diagram schematically showing a first characteristic value profile whose dimension is corrected according to an embodiment of the present disclosure.
Figure 3:
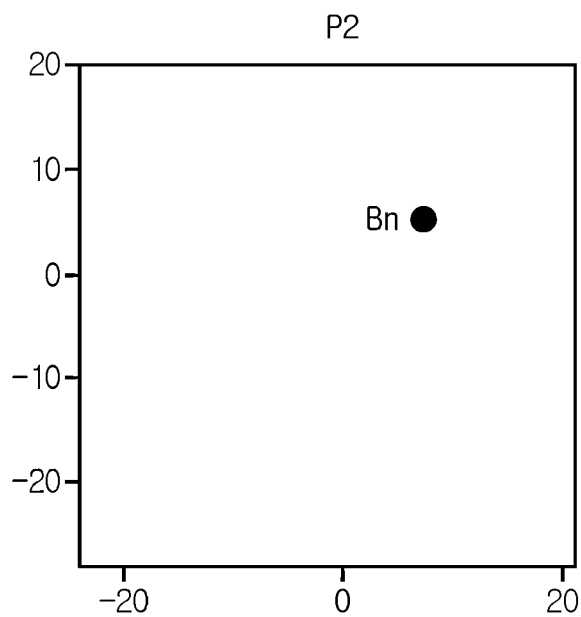
FIG. 3 is a diagram schematically showing a second characteristic value profile whose dimension is corrected according to an embodiment of the present disclosure.
Figure 4:
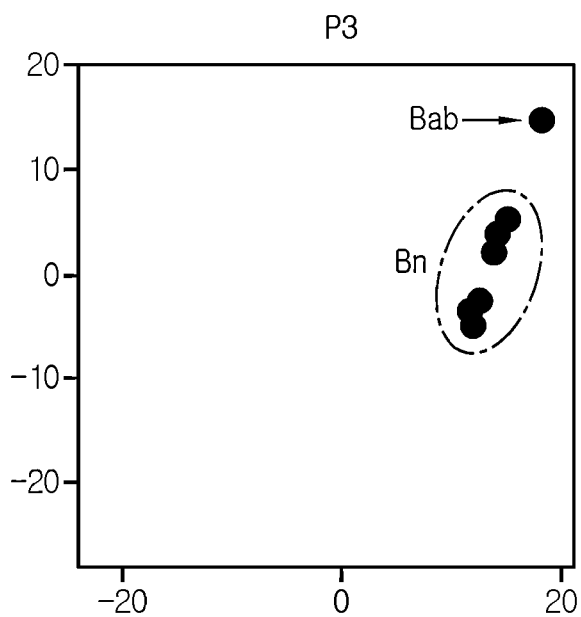
FIG. 4 is a diagram schematically showing a third characteristic value profile whose dimension is corrected according to an embodiment of the present disclosure.

FIG. 2 is a diagram schematically showing a first characteristic value profile P1 whose dimension is corrected according to an embodiment of the present disclosure. FIG. 3 is a diagram schematically showing a second characteristic value profile P2 whose dimension is corrected according to an embodiment of the present disclosure. FIG. 4 is a diagram schematically showing a third characteristic value profile P3 whose dimension is corrected according to an embodiment of the present disclosure.

For example, the embodiment of FIG. 2 is a characteristic value profile for a plurality of batteries included in a first battery module, and may be a first characteristic value profile P1 whose dimension is reduced by the dimension reducing unit 120.

In addition, the embodiment of FIG. 3 is a characteristic value profile for a plurality of batteries included in a second battery module, and may be a second characteristic value profile P2 whose dimension is reduced by the dimension reducing unit 120.

In addition, the embodiment of FIG. 4 is a characteristic value profile for a plurality of batteries included in a third battery module, and may be a third characteristic value profile P3 whose dimension is reduced by the dimension reducing unit 120.

The state diagnosing unit 130 may be configured to detect an outlier in the characteristic value profile whose dimension is reduced by the dimension reducing unit 120.

For example, in the embodiments of FIGS. 2 and 3, an outlier may not be detected in the first characteristic value profile P1 and the second characteristic value profile P2 because the distribution of the plurality of batteries is even. On the other hand, in the embodiment of FIG. 4, since the distribution of one battery among the plurality of batteries is uneven in the third characteristic value profile P3, the corresponding battery may be detected as an outlier.

The state diagnosing unit 130 may be configured to diagnose the state of each of the plurality of batteries based on the detected outlier.

For example, in the embodiments of FIGS. 2 and 3, since an outlier is not detected in the first characteristic value profile P1 and the second characteristic value profile P2, all of the plurality of batteries included in the first battery module and the second battery module may be diagnosed as normal batteries Bn.

On the other hand, in the embodiment of FIG. 4, since one outlier is detected in the third characteristic value profile P3, the battery corresponding to the outlier among the plurality of batteries included in the third battery module may be diagnosed as an abnormal battery Bab, and the remaining batteries may be diagnosed as normal batteries Bn.

That is, the battery diagnosing apparatus 100 according to an embodiment of the present disclosure may diagnose the state of a plurality of batteries according to the plurality of characteristic values, without diagnosing the state of the plurality of batteries based on a single characteristic value. Accordingly, the battery diagnosing apparatus 100 may more accurately diagnose the state of the plurality of batteries. In addition, since the battery diagnosing apparatus 100 diagnoses the state of the plurality of batteries based on the characteristic value profile whose dimension is reduced, the state may be diagnosed quickly, and system resources required for the state diagnosis may be saved.

Meanwhile, the control unit provided to the battery diagnosing apparatus 100 may optionally include a processor, an application-specific integrated circuit (ASIC), another chipset, a logic circuit, a register, a communication modem, and a data processing device, and the like, known in the art to execute various control logics performed in the present disclosure. In addition, when the control logic is implemented in software, the control unit may be implemented as a set of program modules. At this time, the program module may be stored in a memory and executed by the control unit. The memory may be provided in or out of the control unit, and may be connected to the control unit by various well-known means.

In addition, the battery diagnosing apparatus 100 may further include a storage unit. The storage unit may store data or programs necessary for operation and function of each component of the battery diagnosing apparatus 100, data generated in the process of performing the operation or function, or the like. The storage unit is not particularly limited in its kind as long as it is a known information storage means that can record, erase, update and read data. As an example, the information storage means may include RAM, flash memory, ROM, EEPROM, registers, and the like. In addition, the storage unit may store program codes in which processes executable by the control unit are defined.

For example, the storage unit 140 may store the plurality of characteristic values for each of the plurality of batteries extracted by the characteristic value extracting unit 110. Preferably, the storage unit 140 may store the plurality of characteristic values for each of the plurality of batteries as a characteristic value profile. In addition, the dimension reducing unit 120 may obtain the characteristic value profile by accessing the storage unit 140 and reduce the dimension of the obtained characteristic value profile. In addition, the characteristic value profile whose dimension is reduced by the dimension reducing unit 120 may be stored in the storage unit 140.

Hereinafter, a specific embodiment in which the state diagnosing unit 130 detects an outlier in the characteristic value profile whose dimension is reduced will be described.

The state diagnosing unit 130 may be configured to set a criterion value in the characteristic value profile whose dimension is reduced.

For example, the state diagnosing unit 130 may set an average value or a median value for the plurality of batteries in the characteristic value profile whose dimension is reduced as a criterion value.

For example, it is assumed that the characteristic value extracting unit 110 has extracted an x characteristic value, a y characteristic value and a z characteristic value for the first to $n^{th}$ batteries, and the dimension reducing unit 120 has reduced the dimension of the characteristic value profile expressed as (x, y, z) to generate a characteristic value profile expressed as (u, v).

In the characteristic value profile whose dimension is reduced, the characteristic value for the first battery may be expressed as (u1, v1), the characteristic value for the second battery may be expressed as (u2, v2), and the characteristic value for the $n^{th}$ battery may be expressed as (un, vn).

For example, when the criterion value is set as an average value, the state diagnosing unit 130 may calculate an average values (Eu) of u1 to un, and calculate the average values (Ev) of v1 to vn. In addition, the state diagnosing unit 130 may set a criterion value based on the calculated average value. That is, the state diagnosing unit 130 may set the calculated (Eu, Ev) as a criterion value.

As another example, when the criterion value is set as a median value, the state diagnosing unit 130 may select a median value (Mu) of u1 to un, and calculate a median value (Mv) of v1 to vn. In addition, the state diagnosing unit 130 may set the calculated (Mu, Mv) as a criterion value.

The state diagnosing unit 130 may be configured to calculate a weight and a Euclidean distance for each of the plurality of batteries based on the set criterion value.

First, the state diagnosing unit 130 may calculate the weight for the plurality of batteries based on the compactness of the plurality of batteries with respect to the set criterion value. Here, the compactness of the plurality of batteries may mean the degree to which the characteristic values of the plurality of batteries are dispersed based on the criterion value. It may be regarded that the characteristic values of the plurality of batteries are concentrated based on the criterion value as the dispersed degree is small. Therefore, the degree to which the characteristic values of the plurality of batteries are dispersed may be in inverse proportion to the compactness.

For example, when an N number of batteries are provided in total as in the previous embodiment, the state diagnosing unit 130 may calculate the dispersed degree of the characteristic values of the N number of batteries based on the criterion value of the characteristic value profile whose dimension is reduced. That is, one compactness may be calculated for the N number of batteries.

In addition, the state diagnosing unit 130 may calculate a weight for the plurality of batteries based on the compactness calculated for the plurality of batteries.

Preferably, the state diagnosing unit 130 may calculate a weight for the plurality of batteries in proportion to the compactness calculated for the plurality of batteries. For example, the state diagnosing unit 130 may calculate the compactness calculated for the plurality of batteries as a weight for the plurality of batteries.

For example, when the compactness for the N number of batteries is calculated based on the criterion value as in the previous embodiment, the state diagnosing unit 130 may calculate one weight, which can be commonly applied to the N number of batteries, based on the calculated compactness.

In addition, the state diagnosing unit 130 may calculate the Euclidean distance for each of the plurality of batteries based on the set criterion value. Since the Euclidean distance is a method used to calculate the distance between two points, detailed information about it is omitted.

The state diagnosing unit 130 may be configured to detect the outlier based on the weight and the Euclidean distance.

To detect the outlier, the state diagnosing unit 130 may be configured to multiply the Euclidean distance and the weight corresponding to each of the plurality of batteries to calculate an outlier index.

That is, the state diagnosing unit 130 may correct the Euclidean distance for each of the plurality of batteries using the weight. Specifically, the state diagnosing unit 130 may correct the criterion value and the Euclidean distance between the plurality of batteries according to the compactness of the plurality of batteries.

In addition, the state diagnosing unit 130 may be configured to detect the outlier based on the calculated outlier index and a preset threshold value.

Specifically, the state diagnosing unit 130 may be configured to detect a battery of which the calculated outlier index is equal to or greater than the threshold value as the outlier.

For example, in the embodiments of FIGS. 2 and 3, all of the outlier indexes of the plurality of batteries in the first characteristic value profile P1 and the second characteristic value profile P2 may be less than the threshold value. Accordingly, all of the plurality of batteries in the embodiments of FIGS. 2 and 3 may be diagnosed as normal batteries Bn.

Meanwhile, in the embodiment of FIG. 4, the outlier index of one of the plurality of batteries in the third characteristic value profile P3 may be greater than or equal to the threshold value, and the remaining outlier indexes may be less than the threshold value. Accordingly, one of the plurality of batteries in the embodiment of FIG. 4 may be diagnosed as an abnormal battery Bab, and the remaining batteries may be diagnosed as normal batteries Bn.

Meanwhile, the dimension reducing unit 120 may be configured to set perplexity, which is one of the parameters of the predetermined algorithm, to a value less than the number of the plurality of batteries.

In general, in the dimension reducing process, a variable called perplexity is used, and this perplexity is a variable that plays an important role in determining the group (which may also be expressed as a cluster) of the data that appears as a result of dimension reducing. For example, in the t-SNE algorithm, the nearest neighbor is determined by the set perplexity, and the group may be determined in the profile whose dimension is reduced according to the determined nearest neighbor. In general, perplexity is a control factor that starts from an initial value set to obtain good results and is set to an optimal value through an experimental matching process.

Therefore, the dimension reducing unit 120 may effectively group the plurality of batteries in the characteristic value profile whose dimension is reduced by setting the upper limit of the perplexity to be smaller than the number of the plurality of batteries in the process of reducing the dimension of the characteristic value profile.

The state diagnosing unit 130 may be configured to classify the plurality of batteries into at least one group in the characteristic value profile.

Figure 5:
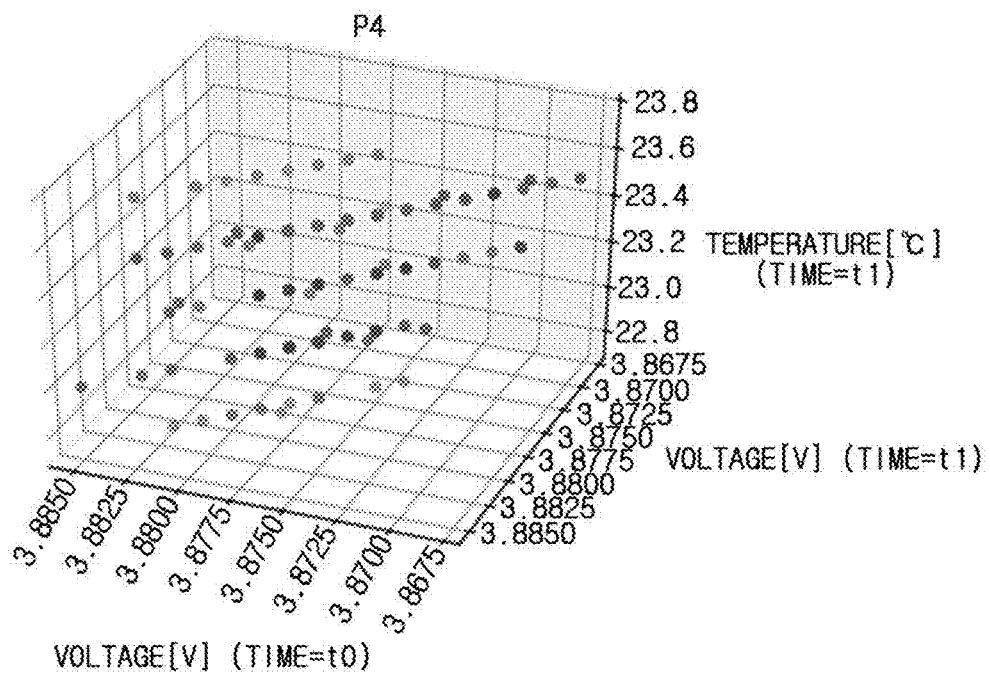
FIG. 5 is a diagram schematically showing a characteristic value profile according to an embodiment of the present disclosure.
Figure 6:
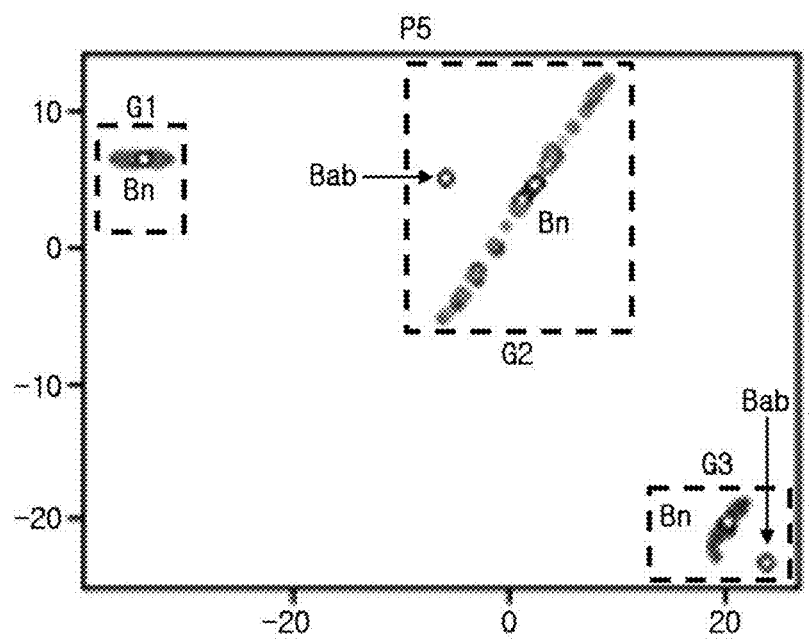
FIG. 6 is a diagram schematically showing a characteristic value profile whose dimension is corrected for the characteristic value profile of FIG. 5.

FIG. 5 is a diagram schematically showing a characteristic value profile P4 according to an embodiment of the present disclosure. FIG. 6 is a diagram schematically showing a characteristic value profile P5 whose dimension is corrected for the characteristic value profile P4 of FIG. 5.

Specifically, FIG. 5 is a characteristic value profile P4 in which the voltage at a time point t0, the voltage at a time point t1, and the temperature at the time point t1 are extracted as characteristic values. In addition, FIG. 6 is a characteristic value profile P5 whose dimension is reduced by the dimension reducing unit 120.

The characteristic value profile whose dimension is reduced may include at least one group.

For example, as in the embodiment of FIGS. 2 to 4, one group may be included in the characteristic value profiles P1, P2, P3 whose dimension is reduced.

As another example, as in the embodiment of FIG. 6, the characteristic value profile P5 whose dimension is reduced may include a plurality of groups G1, G2, G3. Therefore, the state diagnosing unit 130 may determine a first group G1, a second group G2 and a third group G3 in the characteristic value profile P5 whose dimension is reduced.

In addition, the state diagnosing unit 130 may be configured to detect the outlier for each group.

That is, the state diagnosing unit 130 may set a criterion value for each group, and calculate a Euclidean distance of each of the plurality of batteries belonging to the corresponding group based on the set criterion value. In addition, the state diagnosing unit 130 may calculate the compactness of the plurality of batteries belonging to the corresponding group based on the criterion value set for each group, and calculate a weight for each group according to the calculated compactness. Finally, the state diagnosing unit 130 may detect an outlier for each of the plurality of groups based on the weight calculated for each group and the plurality of calculated Euclidean distances (a plurality of Euclidean distances for each of the plurality of batteries belonging to the corresponding group).

On the other hand, the state diagnosing unit 130 may be configured to normalize the characteristic value profile whose dimension is reduced, and to detect the outlier from the normalized characteristic value profile.

The battery may be degraded as it is used, and its internal characteristics may change. In addition, the compactness of the plurality of batteries may be affected by the changed internal characteristics. That is, as the battery is degraded, the compactness of the plurality of batteries may be lowered.

For example, even if it is assumed that all of the plurality of batteries are normal batteries Bn, the compactness for a plurality of batteries in a BOL (Beginning of Life) state and the compactness for a plurality of batteries in a MOL (Middle of Life) or EOL (End of Life) state may be different. That is, due to the effect of degradation, the compactness of the plurality of batteries in the MOL or EOL state may be lower than the compactness of the plurality of batteries in the BOL state. Therefore, even when the plurality of batteries are in the MOL or EOL state, when an outlier is detected by applying the threshold value corresponding to the BOL state as it is, there is a possibility that a normal battery Bn is erroneously diagnosed as an abnormal battery Bab. That is, if the characteristic that a battery is degraded as it is used is not taken into account, the battery state may be erroneously diagnosed.

Accordingly, the state diagnosing unit 130 may first normalize the characteristic value profile whose dimension is reduced in order to minimize the effect of degradation of the plurality of batteries in the process of diagnosing the states of the plurality of batteries based on the outlier detection. In addition, the state diagnosing unit 130 may further improve the accuracy and reliability of the battery state diagnosis by detecting an outlier in the normalized characteristic value profile.

The battery diagnosing apparatus 100 according to the present disclosure may be applied to a BMS (Battery Management System). That is, the BMS according to the present disclosure may include the battery diagnosing apparatus 100 described above. In this configuration, at least some components of the battery diagnosing apparatus 100 may be implemented by supplementing or adding functions of the configuration included in the conventional BMS. For example, the characteristic value extracting unit 110, the dimension reducing unit 120, the state diagnosing unit 130 and the storage unit 140 of the battery diagnosing apparatus 100 may be implemented as components of the BMS. As such, the BMS can control one or more batteries based on information (e.g., battery state diagnosis) obtained by the state diagnosing unit 130.

In addition, the battery diagnosing apparatus 100 according to an embodiment of the present disclosure may be provided to a battery pack 1. That is, the battery pack 1 according to the present disclosure may include the above-described battery diagnosing apparatus 100 and at least one battery cell. In addition, the battery pack 1 may further include electrical equipment (a relay, a fuse, etc.) and a case.

Figure 7:
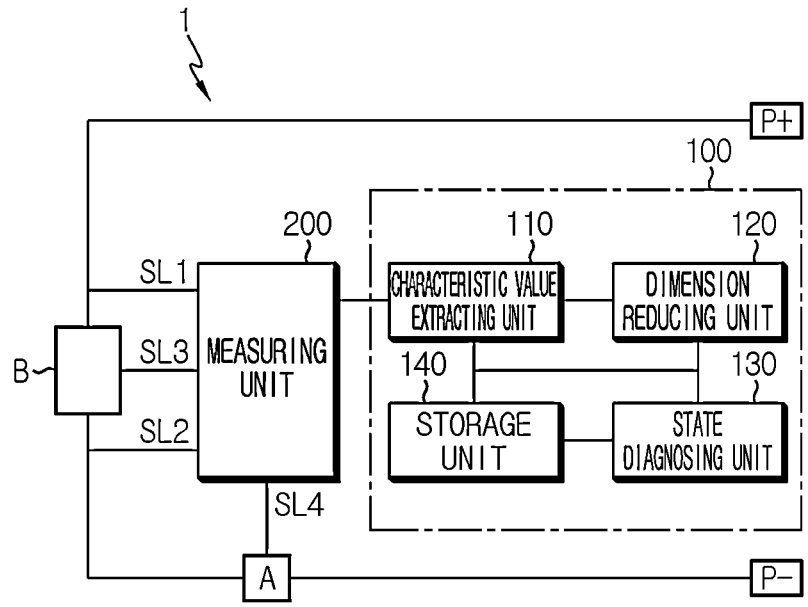
FIG. 7 is a diagram schematically showing an exemplary configuration of a battery pack according to another embodiment of the present disclosure.

FIG. 7 is a diagram schematically showing an exemplary configuration of a battery pack 1 according to another embodiment of the present disclosure.

Referring to FIG. 7, the battery pack 1 may include a plurality of batteries B, a battery diagnosing apparatus 100 and a measuring unit 200.

The measuring unit 200 may be connected to a first sensing line SL1, a second sensing line SL2, a third sensing line SL3, and a fourth sensing line SL4.

The measuring unit 200 may measure the voltage of each of the plurality of batteries B through the first sensing line SL1 and the second sensing line SL2. Although only two sensing lines SL1, SL2 for voltage measurement are shown in the measuring unit 200 in the embodiment of FIG. 7, in reality, a plurality of sensing lines corresponding to the plurality of batteries B may be connected to the measuring unit 200 for voltage measurement.

In addition, the measuring unit 200 may measure the temperature of each of the plurality of batteries B through the third sensing line SL3. For example, the measuring unit 200 may measure the temperature of each of the plurality of batteries B by measuring the heat conducted through the third sensing line SL3. As another example, a temperature sensor may be attached to each of the plurality of batteries B, and the measuring unit 200 may measure the temperature of each of the plurality of batteries B through the third sensing line SL3 connected to the temperature sensor. Similarly, although one sensing line SL3 for temperature measurement is illustrated in the embodiment of FIG. 7, in reality, a plurality of sensing lines corresponding to the plurality of batteries B may be connected to the measuring unit 200 for temperature measurement.

In addition, the measuring unit 200 may be connected to a current measuring unit A provided on a charge/discharge path through the fourth sensing line SL4. For example, the current measuring unit A may be an ampere meter or a shunt resistor. In addition, the charging and discharging path may be a large current path through which a discharging current or a charging current of the plurality of batteries B flows. The measuring unit 200 may measure the current of the plurality of batteries B through the fourth sensing line SL4.

The measuring unit 200 may transmit battery information about the measured voltage, current and temperature of the plurality of batteries B to the characteristic value extracting unit 110. In addition, the characteristic value extracting unit 110 may extract a plurality of characteristic values for each of the plurality of batteries B based on the battery information received from the measuring unit 200.

Figure 8:
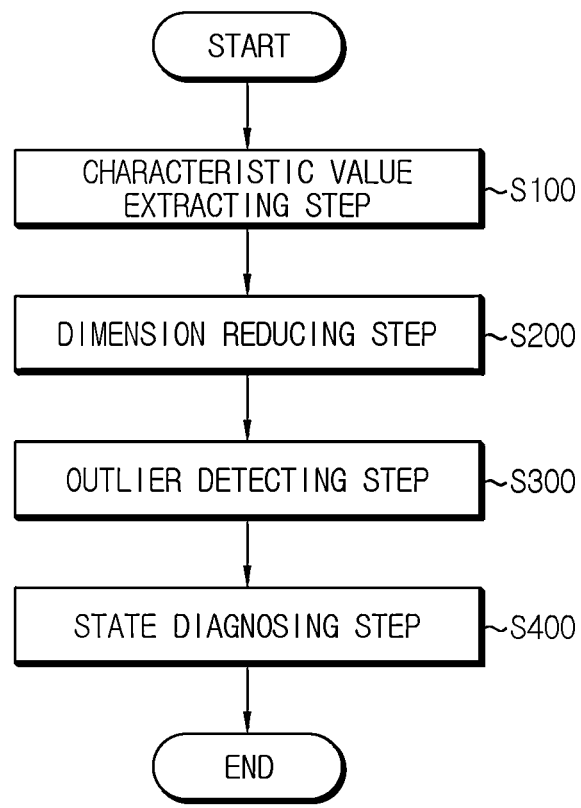
FIG. 8 is a diagram schematically showing a battery diagnosing method according to still another embodiment of the present disclosure.

FIG. 8 is a diagram schematically showing a battery diagnosing method according to still another embodiment of the present disclosure.

Preferably, each step of the battery diagnosing method may be performed by the battery diagnosing apparatus 100.

Hereinafter, it should be noted that content overlapping with the previously described content will be omitted or briefly described.

Referring to FIG. 8, the battery diagnosing method may include a characteristic value extracting step (S100), a dimension reducing step (S200), an outlier detecting step (S300), and a state diagnosing step (S400).

The characteristic value extracting step (S100) is a step of extracting a plurality of characteristic values for each of the plurality of batteries, and may be performed by the characteristic value extracting unit 110.

Preferably, the characteristic value extracting unit 110 may extract a characteristic value having orthogonality for each of the plurality of batteries.

The dimension reducing step (S200) is a step of reducing a dimension of a characteristic value profile representing the distribution of the plurality of batteries using a predetermined algorithm based on the plurality of characteristic values extracted in the characteristic value extracting step (S100), and may be performed by the dimension reducing unit 120.

For example, the dimension reducing unit 120 may reduce the dimension of the characteristic value profile by using the t-SNE algorithm.

The outlier detecting step (S300) is a step of detecting an outlier in the characteristic value profile whose dimension is reduced in the dimension reducing step (S200), and may be performed by the state diagnosing unit 130.

For example, the state diagnosing unit 130 may set a criterion value in the characteristic value profile whose dimension is reduced. The state diagnosing unit 130 may calculate a Euclidean distance for each of the plurality of batteries based on the criterion value. In addition, the state diagnosing unit 130 may calculate compactness for the characteristic values of the plurality of batteries based on the criterion value, and calculate a weight, which can be commonly applied to the plurality of batteries, based on the calculated compactness. In addition, the state diagnosing unit 130 may detect an outlier in the characteristic value profile whose dimension is reduced based on the plurality of calculated Euclidean distances, the calculated weight and a preset threshold value.

If the characteristic value profile whose dimension is reduced includes a plurality of groups, the state diagnosing unit 130 may set a criterion value for each group. For each group, the state diagnosing unit 130 may calculate the Euclidean distance and weight for a plurality of batteries belonging to the corresponding group. The state diagnosing unit 130 may detect an outlier for each group.

The state diagnosing step (S400) is a step of diagnosing the state of each of the plurality of batteries based on the outlier detected in the outlier detecting step (S300), and may be performed by the state diagnosing unit 130.

For example, the state diagnosing unit 130 may diagnose a battery corresponding to the detected outlier as an abnormal battery, and diagnose the remaining batteries as normal batteries.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
100: battery diagnosing apparatus
110: characteristic value extracting unit
120: dimension reducing unit
130: state diagnosing unit
140: storage unit
200: measuring unit
B: plurality of batteries
Bn: normal battery
Bab: abnormal battery

What is claimed is:

1. A battery diagnosing apparatus, comprising:
    a battery management system (BMS) including:
        a characteristic value extracting unit configured to extract a plurality of characteristic values for each of a plurality of batteries of a battery pack;
        a dimension reducing unit configured to reduce a dimension of a characteristic value profile representing a distribution of the plurality of batteries using a predetermined algorithm based on the plurality of characteristic values extracted by the characteristic value extracting unit; and
        a state diagnosing unit configured to detect an outlier in the characteristic value profile whose dimension is reduced by the dimension reducing unit, and diagnose a state of each of the plurality of batteries based on the detected outlier,
    wherein the BMS is a processor or an application-specific integrated circuit,
    wherein the BMS is configured to control the plurality of batteries based on the diagnosis of the state of each of the plurality of batteries obtained by the state diagnosing unit, and
    wherein the state diagnosing unit is configured to set a criterion value in the characteristic value profile whose dimension is reduced, calculate a weight and a Euclidean distance for each of the plurality of batteries based on the set criterion value, and detect the outlier based on the weight and the Euclidean distance.

2. The battery diagnosing apparatus according to claim 1, wherein the state diagnosing unit is configured to calculate the weight for the plurality of batteries based on compactness of the plurality of batteries with respect to the set criterion value.

3. The battery diagnosing apparatus according to claim 1, wherein the state diagnosing unit is configured to calculate an outlier index by multiplying the Euclidean distance and the weight corresponding to each of the plurality of batteries, and detect the outlier based on the calculated outlier index and a preset threshold value.

4. The battery diagnosing apparatus according to claim 3, wherein the state diagnosing unit is configured to detect a battery among the plurality of batteries of which the calculated outlier index is equal to or greater than the threshold value as the outlier.

5. The battery diagnosing apparatus according to claim 1, wherein the state diagnosing unit is configured to classify the plurality of batteries into at least one group in the characteristic value profile, and detect the outlier for each group.

6. The battery diagnosing apparatus according to claim 1, wherein the characteristic value extracting unit is configured to extract the plurality of characteristic values having orthogonality with each other for each of the plurality of batteries.

7. The battery diagnosing apparatus according to claim 1, wherein the dimension reducing unit is configured to set perplexity, which is one of parameters of the predetermined algorithm, to be less than the number of the plurality of batteries.

8. The battery diagnosing apparatus according to claim 1, wherein the state diagnosing unit is configured to normalize the characteristic value profile whose dimension is reduced, and detect the outlier from the normalized characteristic value profile.

9. A battery pack, comprising the battery diagnosing apparatus according to claim 1.

10. An energy storage system, comprising the battery diagnosing apparatus according to claim 1.

11. A battery diagnosing method, comprising:
- a characteristic value extracting step of extracting, via a battery management system (BMS), a plurality of characteristic values for each of a plurality of batteries of a battery pack;
- a dimension reducing step of reducing, via the BMS, a dimension of a characteristic value profile representing a distribution of the plurality of batteries using a predetermined algorithm based on the plurality of characteristic values extracted in the characteristic value extracting step;
- an outlier detecting step of detecting, via the BMS, an outlier in the characteristic value profile whose dimension is reduced in the dimension reducing step;
- a state diagnosing step of diagnosing, via the BMS, a state of each of the plurality of batteries based on the outlier detected in the outlier detecting step; and
- controlling, via the BMS, the plurality of batteries based on the diagnosis of the state of each of the plurality of batteries obtained in the state diagnosing step, wherein the state diagnosing step includes setting a criterion value in the characteristic value profile whose dimension is reduced, calculating a weight and a Euclidean distance for each of the plurality of batteries based on the set criterion value, and detecting the outlier based on the weight and the Euclidean distance.

* * * * *